(12) United States Patent
Lee et al.

(10) Patent No.: US 6,524,970 B1
(45) Date of Patent: Feb. 25, 2003

(54) METHOD FOR GROWING A BARIUM TITANATE LAYER

(75) Inventors: Ming-Kwei Lee, Kaohsiung (TW); Hsin-Chih Liao, Kaohsiung Hsien (TW)

(73) Assignee: Winbond Electronics Corp., Hsinchu (TW)

(*) Notice: Subject to any disclaimer, the term of this patent is extended or adjusted under 35 U.S.C. 154(b) by 0 days.

(21) Appl. No.: 09/427,109

(22) Filed: Oct. 26, 1999

(30) Foreign Application Priority Data

Jul. 14, 1999 (TW) ........................... 88111915 A

(51) Int. Cl.⁷ ............................................. H01L 21/31

(52) U.S. Cl. .................... 438/778; 438/785; 438/782

(58) Field of Search .......................... 427/126.3, 126.2, 427/430.1, 443.2; 117/949; 423/598; 501/137; 438/785; 361/321.4, 321.1; 524/445, 447

(56) References Cited

U.S. PATENT DOCUMENTS 5,617,290 A * 4/1997 Kulwicki et al. ........ 361/321.4
5,998,528 A * 12/1999 Tsipursky et al. ........... 524/445

* cited by examiner

*Primary Examiner*—Olik Chaudhuri
*Assistant Examiner*—Shrinivas H. Rao
(74) *Attorney, Agent, or Firm*—Ladas & Parry

(57) ABSTRACT

This invention disclose a method for growing a barium titanate layer by means of liquid phase deposition (LPD), which characterizes by low cost, low-temperature growth, and easily practice. This novel method for growing a barium titanate characterizes by mixing a barium nitrate solution and hexafluorotitanic acid solution to produce a barium titanate solution. Next, a boric acid solution is added to the barium titanate solution to prepare a barium titanate growth solution. Then a substrate, such as a wafer, ready to grow a barium titanate layer thereon is dipped in this growth solution for a period of time at a suitable temperature. Thereafter, a barium titanate dielectric layer with the properties of high dielectric constant, low leakage current and breakdown resistant can be formed on the substrate.

13 Claims, 6 Drawing Sheets

METHOD FOR GROWING A BARIUM TITANATE LAYER

FIELD OF THE INVENTION

This invention relates to a semiconductor process, particularly relates to a method for growing a barium titanate layer by means of liquid phase deposition (LPD).

BACKGROUND OF THE INVENTION

During the development of integrated circuits (ICs), the shrinkage of the device size can directly enhance the element density and reduce the delivery time of data. Consequently, the function and the application of the products will be widely enlarged. Thus, narrowing down the designing size of the device is always the devoted objective in IC industries. The IC has developed from LSI into ULSI in the past 20 years, wherein the DRAM is one of the important IC products.

In current IC process, silicon dioxide is the primary dielectric material used in the DRAM capacitor. With the increasing of the memory density of DRAM and the shrinking surface area of the memory cell, the thickness of the silicon dioxide used as the dielectric layer of the capacitor is reduced from 1000 Å to 100 Å. Considering the development tendency, the thickness of silicon dioxide will be reduced to 35 Å soon, however the dielectric constant of the silicon dioxide with a thickness of 35 Å reaches only 3.9, which can not satisfy the requirement of advanced IC industries. Since it is necessary to provide enough charge storage capacity within a desired device area to remain the ability of signal processing. Therefore, it's hard to further enhance the charge storage capacity by using the conventional silicon dioxide with low dielectric constant as the dielectric layer of the capacitor.

Therefore, it is urgent to develop a dielectric material with high dielectric constant, low leakage current and breakdown resistant, used as the dielectric layer of the capacitor to satisfy the requirement of the DRAM memory with the properties of high memory density and high charge storage within the limiting area.

$BaTiO_3$ has properties of high dielectric constant (about 22.3), low leakage current (about $9.48 \times 10^{-7}$ $A/cm^2$) and breakdown resistant; therefore, $BaTiO_3$ is suitable to be the dielectric layer of the DRAM capacitor. So far, the deposition methods for $BaTiO_3$ include Sol-gel, CVD and sputtering. Although Sol-gel proceeds at a low temperature, it needs a post high temperature treatment, however the wafer will deform and the doped impurities therein will re-distribute after annealing. According, the structure of devices will be damaged. Moreover, the drawback of CVD is the requirement of expensive apparatuses and proceeding at high-temperature (400~800° C.). Although, sputtering is a low-temperature growing method, but the damage caused by the radiation emitted during the sputtering process is unavoidable. In brief, these three methods for growing the $BaTiO_3$ layer exist various drawbacks when used to grow the $BaTiO_3$ layer.

On the other hand, the apparatuses for liquid phase deposition (LPD) are cheap, and the growth temperature is low (ranging from 25° C. to 80° C.). Moreover, the process of LPD is easily to practice, and the thermal effect produced during growth is avoidable. Consequently, the cost for deposition can be highly reduced. According, this invention discloses a novel method for growing the $BaTiO_3$ layer by means of LPD to satisfy the requirement of advanced IC products.

SUMMARY OF THE INVENTION

This invention disclose a method for growing a barium titanate layer by means of liquid phase deposition (LPD), which characterizes by low cost, low-temperature growth, and easily practice. This novel method for growing a barium titanate characterizes by mixing a barium nitrate solution and hexafluorotitanic acid solution to produce a barium titanate solution. Next, a boric acid solution is added to the barium titanate solution to prepare a barium titanate growth solution. Then a substrate, such as a wafer, ready to grow a bariumtitanate layer thereon is dipped in this growth solution for a period at a suitable temperature. Thereafter, a barium titanate dielectric layer with the properties of high dielectric constant, low leakage current and breakdown resistant can be formed on the substrate.

DETAILED DESCRIPTION OF THE INVENTION

This invention discloses a novel method for growing a barium titanate layer used as the DRAM dielectric layer, whereon the low-cost LPD is applied to grow the barium titanate layer at low temperature. First, a hexafluorotitanic acid ($H_2TiF_6$) solution is mixed with a barium nitrate solution to form a growth solution. Next, a boric acid solution is added to the growth solution to react with the hydrofluoric acid and subsequently enhance the concentration of barium titanate, then a barium titanate growth solution is obtained. Next, a substrate ready for growing a barium titanate layer thereon is diped in this barium titanate growth solution for a predetermined time. Thereafter, a barium titanate can be formed on the substrate. Moreover, the growing rate of the LPD-$BaTiO_3$ layer is related to the concentration of barium titanate within the barium titanate growth solution and temperature during the growth. The thickness of the $BaTiO_3$ layer depends on the concentration of $BaTiO_3$ within the growth solution. According, the concentration of $BaTiO_3$ for growing on the substrate can be controlled by adjusting the concentration of the hexafluorotitanic acid solution and barium nitrate solution, and the growth temperature and the growth time.

This invention discloses a novel growth method for $BaTiO_3$ layer. First, a $BaTiO_3$ growth solution is prepared first, then a cleaned substrate is dipped into the $BaTiO_3$ solution at a fixed temperature for a period to grow a $BaTiO_3$ layer on to the substrate. Wherein the $BaTiO_3$ growth solution is prepared by mixing a 0.01M to 0.34M barium nitrate solution with a 2.00M~6.10M hexafluorotitanic acid solution, then adding a 0.10M~0.90M boric acid solution and mixed well.

This invention discloses another novel growth method for BaTiO$_3$ layer. First, a BaTiO$_3$ growth solution is prepared first by mixing a 0.01M~0.34M barium nitrate solution with a 2.00M~6.10M hexafluorotitanic acid solution to produce a barium titanate solution. Next, a 0.10M~0.90M boric acid solution is added into the bariumtitanate solution, and mixed well to produce a growth solution for barium titanate layer. Then, a cleaned substrate is dipped into the BaTiO$_3$ solution at a constant temperature ranging from 25° C. to 95° C. for a period of time to grow a BaTiO$_3$ layer on to the substrate. Finally, the substrate dipped in the growth solution for BaTio$_3$ layer is took out and blow-dry with nitrogen, then a wafer with a BaTiO$_3$ layer thereon is obtained.

EMBODIMENTS OF THE INVENTION

Embodiment 1

This embodiment was proceeded by growing a barium titanate layer on a N-type silicon wafer by means of LPD. Moreover, electric properties, such as dielectric constant, and leakage current and breakdown resistant, of the obtained barium titanate were tested.

Figure 1:
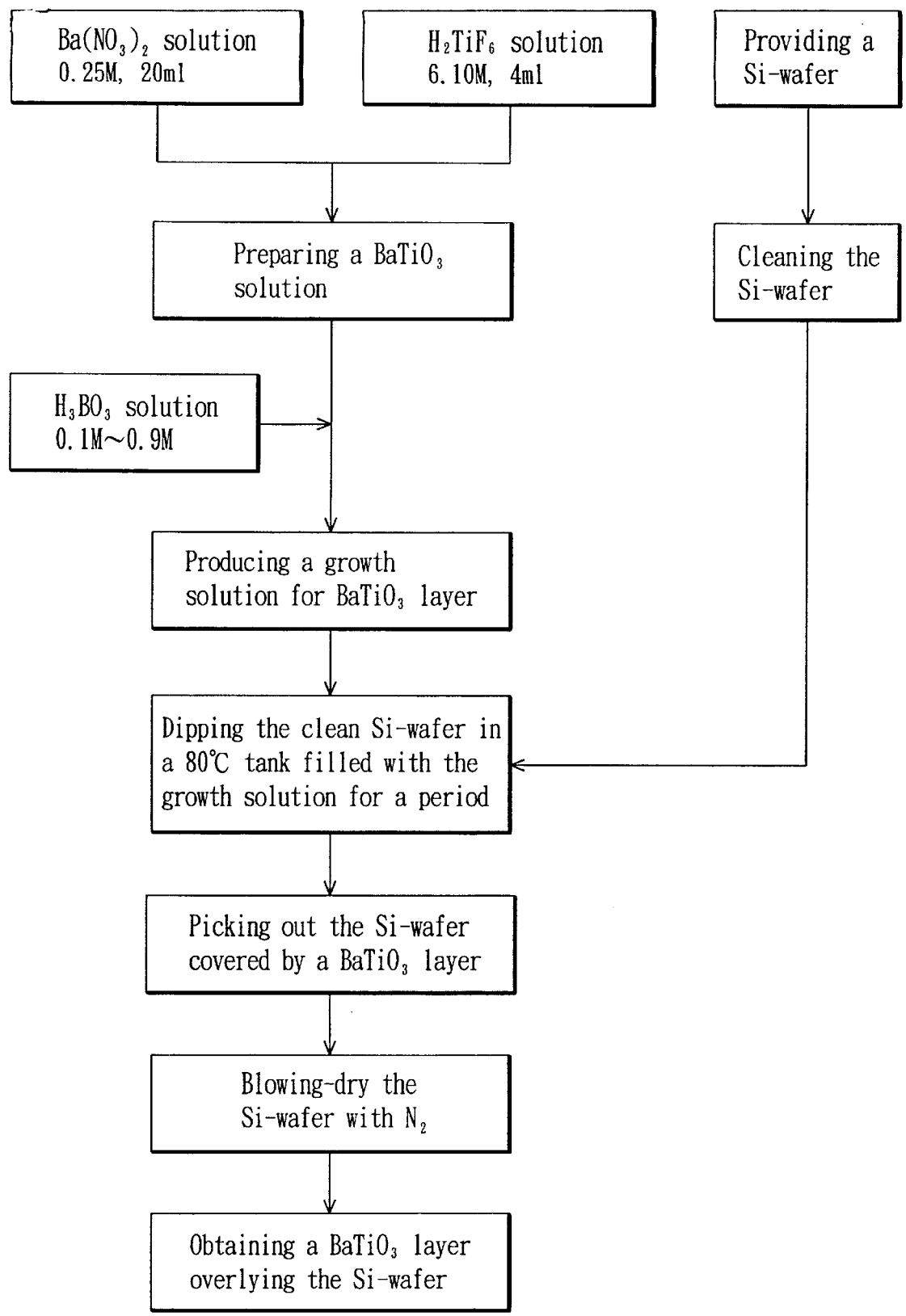
FIG. 1 is a flow chart of the method for growing a LPD-$BaTiO_3$ layer according to this invention.

First, referring to the flow chart shown in FIG. 1, wherein an N-type silicon wafer ready for growing a barium titanate thereon was provided first. Then, the wafer was washed according to the following process:

1. The wafer was dipped in acetone and ultrasonic vibrated for 15 min. Then, the wafer was washed with deionized water to remove the contaminated oil on the wafer;
2. The wafer obtained in step 1 was transferred to a hot sulfuric acid solution for 5 min., and washed again with deionized water to remove residuary metallic ions;
3. The wafer obtained in step 2 was transferred to a hot nitric acid solution for 5 min., then washed with deionized water to grow a thin native oxide layer on the wafer;
4. The wafer obtained in step 3 was transferred to a 49% hydrofluoric acid solution (HF/H$_2$O=1/10) for 30 seconds, to remove the thin native oxide layer formed in step 3; and
5. The wafer obtained in step 4 was transferred to a hot nitric acid solution for 5 minutes, then washed with deionized water to grow a native oxide with an average thickness.

Next, a growth solution for barium titanate layer was prepared, wherein 20 ml of 0.25M barium nitrate solution and 4 ml of 6.10M hexafluorotitanic acid solution was mixed well to produce a barium titanate solution through the reaction as shown in equilibrium formula 1:

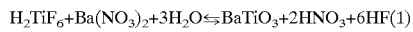

$$H_2TiF_6+Ba(NO_3)_2+3H_2O \leftrightharpoons BaTiO_3+2HNO_3+6HF \quad (1)$$

Then, 2 ml of 0.1M~0.9M boric acid solution was added into the barium titanate solution. The equilibrium formula 1 was driven rightward by reacting the boric acid with the hydrofluoric acid (formula 2) produced in equilibrium formula 1 to break the equilibrium of formula 1, and subsequently enhance the concentration of barium titanate therein. Then a growth solution for depositing a barium titanate layer was obtained.

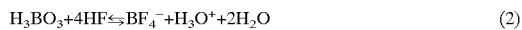

$$H_3BO_3+4HF \leftrightharpoons BF_4^- + H_3O^+ + 2H_2O \quad (2)$$

Following, the cleaned wafer was dipped in a tank with the growth solution for barium titanate, maintaining constantly at 80° C. to grow a barium titanate layer on the wafer.

Figure 2:
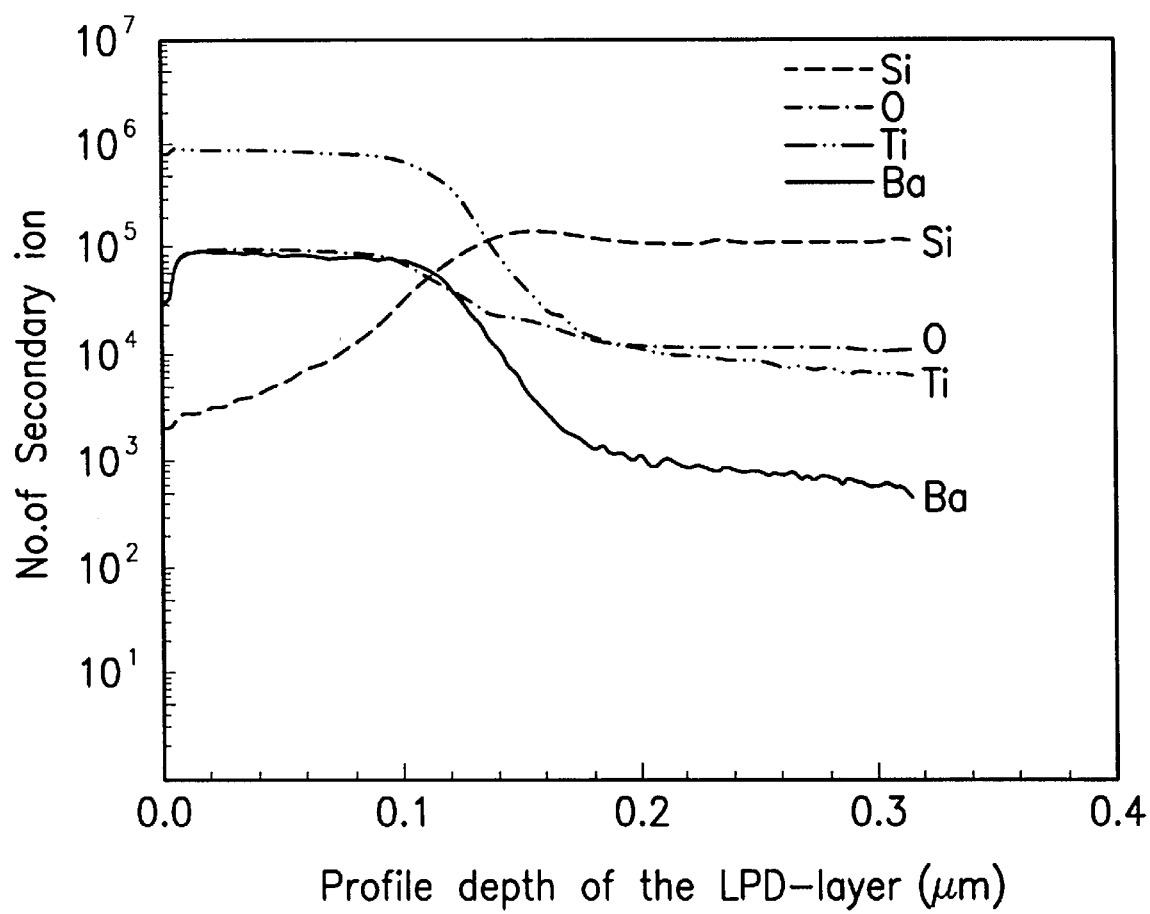
FIG. 2 is the secondary ion mass spectroscopy of the LPD-BaTiO3 layer according to this invention.

The composition of the obtained barium titanate layer was analyzed by secondary ion mass spectroscopy (e.g. CAMECA ims 4f Secondary Ion Mass Spectroscopy). As shown in FIG. 2, the composition of this barium titanate comprises of certain amount of barium, titanium, oxygen and so on. The result proves that the composition of this deposited layer primarily comprises of BaTiO$_3$. Moreover, the thickness of the LPD-BaTiO$_3$ layer estimated according to the depth profiles ranges from 950 Å to 1050 Å, close to 1000 Å examined by means of the ellipsometer. In addition, the estimated interface transition region in FIG. 2 is about 300 Å, and the curve trend within the thicker area is quite smooth, which indicates the primary components, such as barium, titanium and oxygen, are distributed uniformly within this LPD-BaTiO$_3$ layer.

Figure 3:
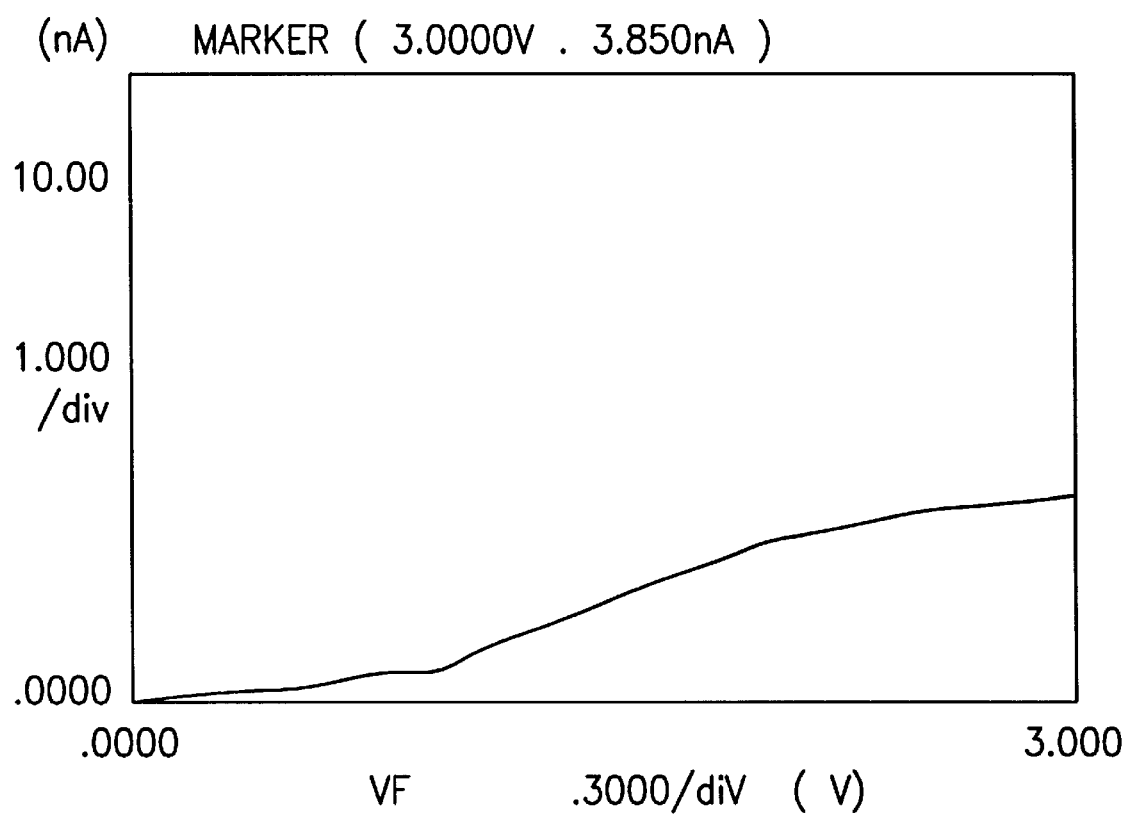
FIG. 3 is the leakage current analysis of the LPD-$BaTiO_3$layer according to this invention.

Moreover, the leakage current of this deposited BaTiO$_3$ according to this invention was determined by means of the semiconductor-parameter analyzer (Hewlett-Packard 4145B). FIG. 3 shows the leakage current of a barium titanate sample with a thickness of 1000 Å examined by means of an ellipsometer with a voltage ranging from 0V to 3V is applied. As shown in FIG. 3, when the input voltage is 3V, the leakage current is 3.65×10$^{-9}$ A, and the current density is 9.48×10$^{-7}$ A/cm$^2$.

Figure 4:
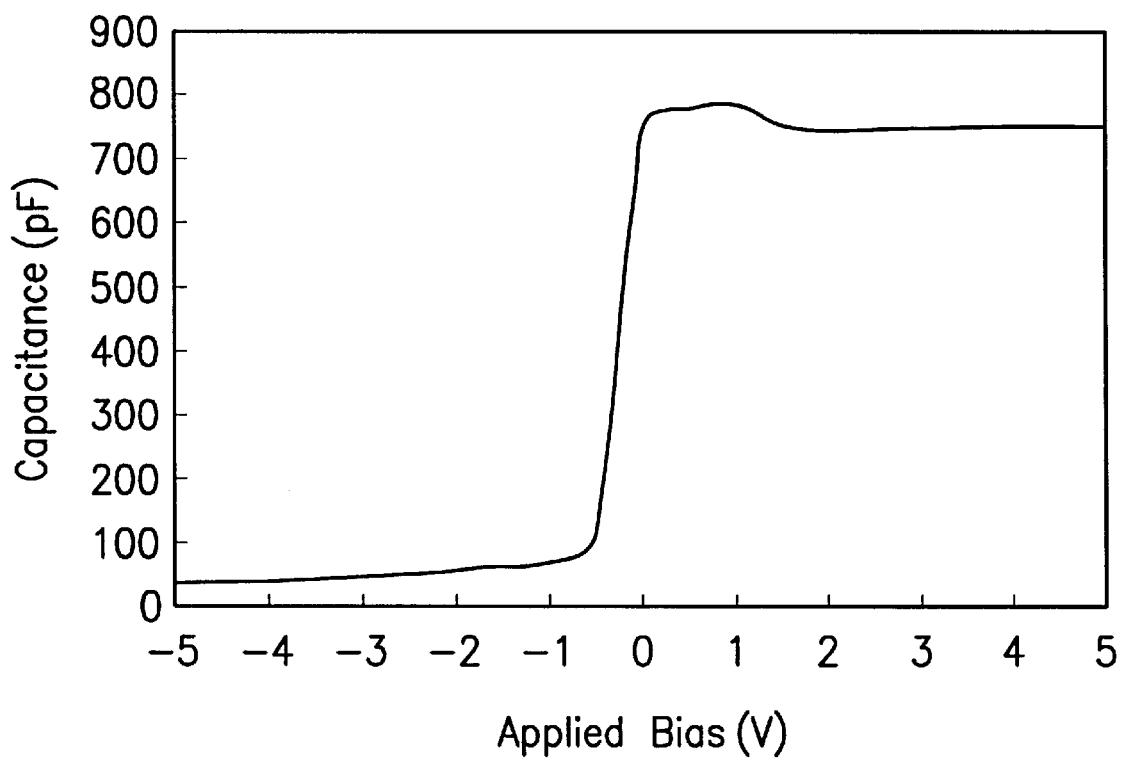
FIG. 4 shows the relationship of the capacitance and voltage of the LPD-$BaTiO_3$ layer according to this invention.

In addition, the capacitance-voltage (C-V) property of the barium titanate sample was determined by a C-V meter (HP-4280A). Because the wafer used in this embodiment was N-type, wherein the doping concentration ranged from 10$^{14}$ to 10$^{15}$ atoms/cm$^3$, and the resistivity ranged from 14 to 21Ω-cm. Moreover, the thickness of this barium titanate sample was 1000 Å, and the contacting area of the LPD-BaTiO$_3$ layer and the electrode was 3.85×10$^{-3}$cm$^2$. The detecting voltage ranged from −5V to 5V. Referring to FIG. 4, when the input voltage was 1V, the detected capacitance was 759 pF, and the dielectric constant was 22.3, and the effectual charge was 1.22×10$^{11}$cm$^2$.

According to formula 1, the hexafluorotitanic acid solution reacts with the barium nitrate solution to produce barium titanate and hydrofluoric acid. When a boric acid solution is added to the equilibrium reaction, the boric acid will react with the hydrofluoric acid within the equilibrium reaction as shown in formula 2, then the formula will react rightward caused by the consumption of hydrogen fluoride. Therefore, the concentration of barium titanate will be enhanced.

The controlling factors of this reaction include the concentration of boric acid and the growth temperature for this LPD-BaTiO$_3$ layer. The growing rate depends on these two factors will be illustrated in following embodiment 2 and embodiment 3.

Embodiment 2

This embodiment was proceeded according to the LPD disclosed in embodiment 1, except that the concentration of the boric acid solution was 0.1M, 0.3M, 0.5M, 0.7M and 0.9M. The deposition was proceeded at 80° C. for 32 min. When the deposition was finished, the thickness of the obtained barium titanate layer was measured, and a curve of the concentration of boric acid verse the deposition rate of the barium titanate layer (Å/min.). The curve was shown in FIG. 5. According to formula 2, when the concentration of the boric acid was rose from 0.1M to 0.7M, the depleted hydrofluoric acid will be enhanced. However, when the concentration of boric acid exceeded 0.7M, the deposition rate of the LPD-BaTiO$_3$ decreased with the increasing concentration of boric acid. Because boron ions (B$^{3+}$) increases with the concentration of boric acid, and the excess boron ions will occupy available deposition sites, therefore the deposition of $BaTiO_3$ will be inhibited. Consequently, the factor affecting the deposition of $BaTiO_3$ is boron ions when the concentration of boric acid exceeds 0.7M.

Figure 5:
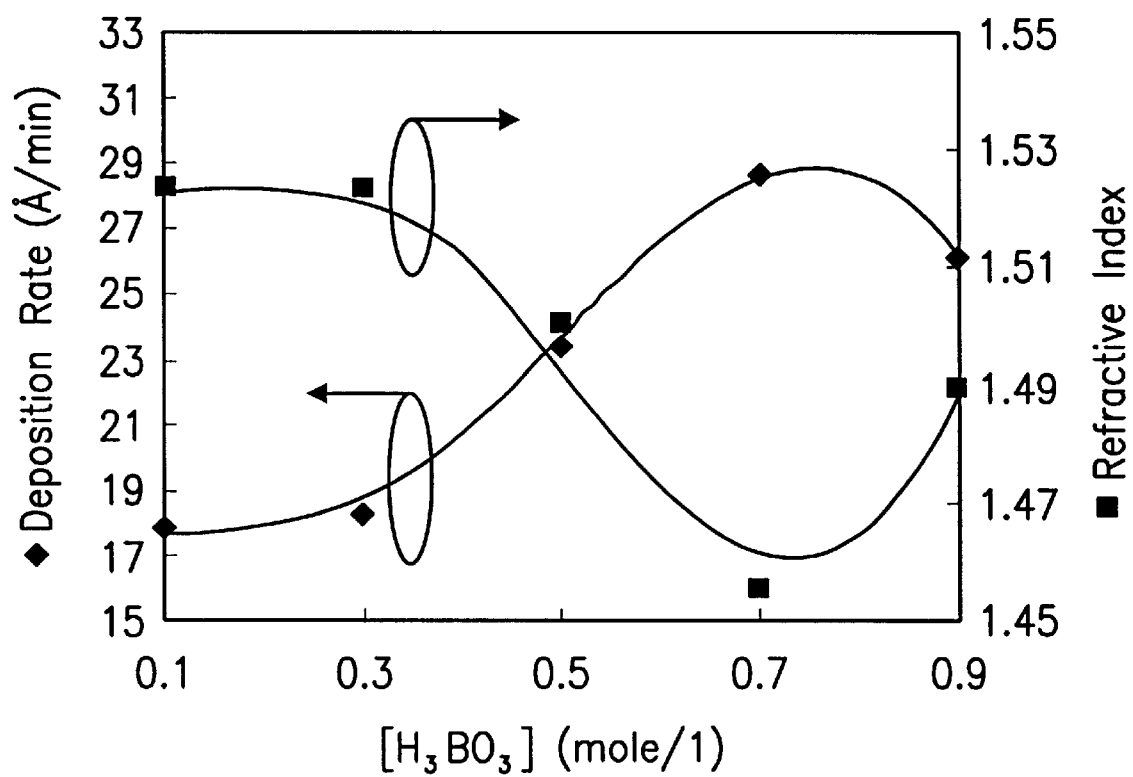
FIG. 5 shows the relationships of the concentration of boric acid verse the deposition rate and the refractive index of the $BaTiO_3$ layer according to this invention.

Moreover, another curve in FIG. 5 shows the refractive index of the barium titanate layer. As shown in FIG. 5, owing to the density of the LPD-BaTiO3 layer decreases with the increasing deposition rate of $BaTiO_3$, therefore the refractive index decreases with the increasing deposition rate of $BaTiO_3$.

Embodiment 3

Figure 6:
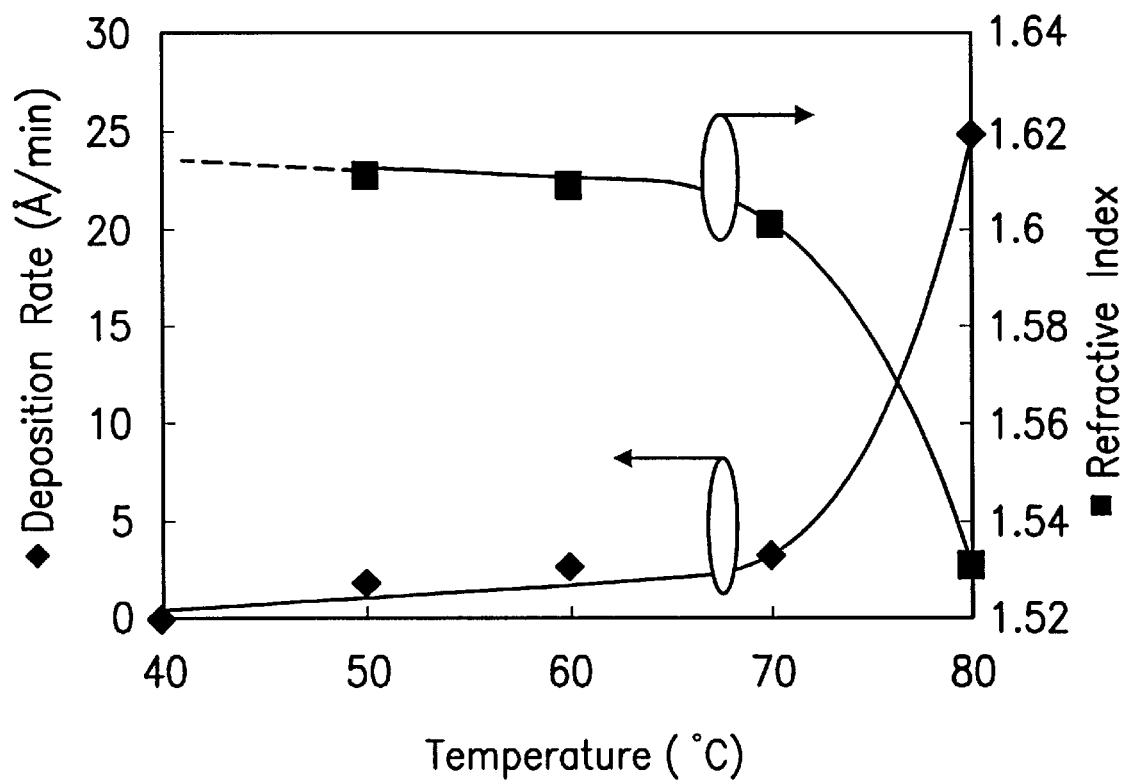
FIG. 6 shows the relationships of the temperature verse the deposition rate and the refractive index of the $BaTiO_3$ layer according to this invention.

This embodiment was proceeded according to the deposition method disclosed in embodiment 1, wherein 2 ml of 3M boric acid was added, and the deposition was respectively proceeded at various temperature (40° C., 50° C., 60° C., 70° C. and 80° C.) for 40 min. When the deposition was finished, the thickness of the barium titanate layer was determinted, and a curve of the deposition temperature verse the deposition rate of barium titanate was plotted in FIG. 6. Referring to FIG. 6, when the deposition temperature is less than 70° C., the deposition rate of the barium titanate layer is low because the ions participated in the reaction can not obtained enough activation energy (about 0.84 eV), therefore the obtained barium titanate is dense, resulting in high refractive index. On the other hand, when the deposition temperature is higher than 70° C., the deposition rate of the barium titanate layer is high because the ions participated in the reaction can obtained enough activation energy, therefore the obtained barium titanate is not dense, resulting in low refractive index.

According to the results obtained in embodiments 2 and 3, the thickness of barium titanate layer deposited according to this invention can be controlled by adjusting the concentration of boric acid sulution and the deposition temperature.

From the above description, one skilled in this art can easily ascertain the essential characteristics of the present invention, and, without departing from the spirit and scope thereof, can make various changes and modifications of the invention to adapt it to various usage and conditions. Thus, other embodiments also fall within the scope of the following claims.

What is claimed is:

1. A method for growing a barium titanate layer on a semiconductor wafer comprising:

providing a barium nitrate aqueous solution;

providing a hexatluorotitanic acid solution;

mixing the barium nitrate aqueous solution with the hexafluorotitanic acid solution to produce a barium titanate solution;

mixing a boric acid solution with the barium titanate solution to produce a barium titanate layer growth solution; and dipping the wafer in the barium titanate layer growth solution for a desired time to grow a harium titanate layer on the wafer.

2. The method as claimed in claim 1, wherein the concentration of the barium nitrate ranges from 0.01M to 0.34M.

3. The method as claimed in claim 1, wherein the concentration of the hexafluorotitanic acid ranges from 2.00M to 6.10M.

4. The method as claimed in claim 1, wherein the concentration of the boric acid ranges from 0.10M to 0.90M.

5. The method as claimed in claim 1, wherein the growth temperature of the barium titanate ranges from 25° C. to 95° C.

6. A method for growing a barium titanate layer on a semiconductor wafer, comprising:

providing a barium titanate layer growth solution; and dipping the wafer in the growth solution for a desired time to grow a barium titanate layer con the wafer.

7. The method as claimed as claim 6, wherein the preparation of the barium titanate layer growth solution comprises:

a) providing a combined solution comprising a barium nitrate solution mixed with a hexafluorotitanic acid solution; and b) mixing a boric acid solution with the combined solution to form a growth solution of barium titanate layer.

8. The method as claimed in claim 7, wherein the concentration of the barium nitrate solution ranges from 0.01 to 0.34M.

9. The method as claimed in claim 7, wherein the concentration of the hexafluorotitanic acid ranges from 2.00M to 6.10M.

10. The method as claimed in claim 7, wherein the concentration of the boric acid ranges from 0.10M to 0.90M.

11. The method as claimed in claim 1, wherein the growth temperature of the barium titanate ranges from 25° C. to 95° C.

12. The method of claim 1 wherein the wafer is exposed in the barium titanate layer growth solution by dipping the wafer in same.

13. The method of claim 7 wherein the wafer is exposed in the barium titanate layer growth solution by dipping the wafer in same.

* * * * *